(12) United States Patent
Haratsch et al.

(10) Patent No.: US 9,898,361 B2
(45) Date of Patent: Feb. 20, 2018

(54) MULTI-TIER DETECTION AND DECODING IN FLASH MEMORIES

(71) Applicant: Seagate Technology LLC, Cupertino, CA (US)

(72) Inventors: Erich F. Haratsch, Bethlehem, PA (US); Abdel Hakim S. Alhussien, San Jose, CA (US)

(73) Assignee: Seagate Technology LLC, Cupertino, CA (US)

( * ) Notice: Subject to any disclaimer, the term of this patent is extended or adjusted under 35 U.S.C. 154(b) by 0 days.

(21) Appl. No.: 13/731,551

(22) Filed: Dec. 31, 2012

(65) Prior Publication Data

US 2013/0185598 A1    Jul. 18, 2013

Related U.S. Application Data

(63) Continuation-in-part of application No. 13/063,874, filed on Mar. 14, 2011, now Pat. No. 9,064,594, and a continuation-in-part of application No. 12/920,407, filed on Jan. 4, 2011, now Pat. No. 8,724,381, and a continuation-in-part of application No. 13/001,278, filed on Feb. 25, 2011, now Pat. No. 8,462,549, and a continuation-in-part of application No. 13/063,888, (Continued)

(51) Int. Cl.
*G06F 11/10* (2006.01)
*G11C 16/34* (2006.01)
*G11C 11/56* (2006.01)

(52) U.S. Cl.
CPC .......... *G06F 11/10* (2013.01); *G06F 11/1048* (2013.01); *G06F 11/1072* (2013.01); *G11C 16/34* (2013.01); *G11C 11/56* (2013.01)

(58) Field of Classification Search
CPC .. G06F 11/1048; G06F 11/10; G06F 12/0246; G06F 2212/2022; G11C 11/56; G11C 16/3495; G11C 16/34
See application file for complete search history.

(56) References Cited

U.S. PATENT DOCUMENTS 5,867,429 A    2/1999 Chen et al.
6,134,141 A   10/2000 Wong
(Continued)

FOREIGN PATENT DOCUMENTS

JP    H11283396    10/1999
JP    2000149592    5/2000
(Continued)

*Primary Examiner* — Sanjiv Shah
*Assistant Examiner* — Glenn Gossage
(74) *Attorney, Agent, or Firm* — Ryan, Mason & Lewis, LLP

(57) ABSTRACT

Methods and apparatus are provided for multi-tier detection and decoding in flash memory devices. Data from a flash memory device is processed by obtaining one or more read values for at least one bit in a given page of the flash memory device; converting the one or more read values for the at least one bit to a reliability value; performing an initial decoding of the at least one bit in a given page using the reliability value; and performing an additional decoding of the at least one bit in the given page if the initial decoding is not successful, wherein the additional decoding uses one or more of additional information for the given page and at least one value for at least one bit from at least one additional page.

30 Claims, 11 Drawing Sheets

Related U.S. Application Data filed on Aug. 31, 2011, now Pat. No. 8,830,748, and a continuation-in-part of application No. 13/063,895, filed on May 31, 2011, now Pat. No. 9,378,835.

(56) References Cited

U.S. PATENT DOCUMENTS

| | | |
|---|---|---|
| 6,522,580 B2 | 2/2003 | Chen et al. |
| 6,980,140 B1 | 12/2005 | Rowland et al. |
| 7,257,026 B2 | 8/2007 | Yamada et al. |
| 7,257,032 B2 | 8/2007 | Fujiu et al. |
| 7,349,264 B2 | 3/2008 | Mokhlesi et al. |
| 7,388,781 B2 | 6/2008 | Litsyn et al. |
| 7,457,155 B2 | 11/2008 | Nazarian |
| 7,508,704 B2 * | 3/2009 | Honma et al. ........... 365/185.03 |
| 7,525,839 B2 | 4/2009 | Shibata et al. |
| 7,558,109 B2 | 7/2009 | Brandman |
| 7,573,739 B2 | 8/2009 | Yun et al. |
| 7,593,267 B2 | 9/2009 | Fujiu et al. |
| 7,643,342 B2 | 1/2010 | Litsyn et al. |
| 7,656,707 B2 | 2/2010 | Kozlov |
| 7,730,384 B2 | 6/2010 | Graef et al. |
| 7,768,830 B2 | 8/2010 | Shibata et al. |
| 7,877,564 B2 | 1/2011 | Eldredge |
| 7,917,832 B2 | 3/2011 | Hsieh et al. |
| 7,975,192 B2 | 7/2011 | Sommer et al. |
| 8,032,810 B2 | 10/2011 | Ishikawa et al. |
| 8,830,748 B2 | 9/2014 | Haratsch et al. |
| 9,294,132 B1 * | 3/2016 | Peleato-Inarrea . H03M 13/2948 |
| 2006/0015802 A1 | 1/2006 | Hocevar |
| 2006/0120162 A1 | 6/2006 | Fujiu et al. |
| 2006/0195772 A1 | 8/2006 | Graef et al. |
| 2006/0221714 A1 | 10/2006 | Li et al. |
| 2007/0089034 A1 | 4/2007 | Litsyn et al. |
| 2007/0171714 A1 | 7/2007 | Wu et al. |
| 2007/0189073 A1 | 8/2007 | Aritome |
| 2007/0208905 A1 | 9/2007 | Litsyn et al. |
| 2007/0279982 A1 | 12/2007 | Shibata et al. |
| 2007/0280000 A1 | 12/2007 | Fujiu et al. |
| 2007/0300130 A1 | 12/2007 | Gorobets |
| 2008/0019188 A1 | 1/2008 | Li |
| 2008/0034159 A1 | 2/2008 | Kim |
| 2008/0055984 A1 | 3/2008 | Nazarian |
| 2008/0092014 A1 | 4/2008 | Brandman et al. |
| 2008/0092015 A1 | 4/2008 | Brandman et al. |
| 2008/0092026 A1 * | 4/2008 | Brandman et al. ......... 714/793 |
| 2008/0109703 A1 * | 5/2008 | Brandman ............... 714/763 |
| 2008/0123420 A1 | 5/2008 | Brandman et al. |
| 2008/0151617 A1 | 6/2008 | Alrod et al. |
| 2008/0162791 A1 | 7/2008 | Eldredge |
| 2008/0244360 A1 | 10/2008 | Mokhlesi et al. |
| 2008/0291724 A1 | 11/2008 | Litsyn et al. |
| 2009/0043951 A1 | 2/2009 | Shalvi et al. |
| 2009/0067237 A1 * | 3/2009 | Lee .................... G11C 16/3418 365/185.03 |
| 2009/0190399 A1 | 7/2009 | Shibata et al. |
| 2009/0228761 A1 * | 9/2009 | Perlmutter et al. ........... 714/763 |
| 2009/0234792 A1 * | 9/2009 | Kim et al. ................. 706/50 |
| 2009/0241008 A1 | 9/2009 | Kim et al. |
| 2009/0241009 A1 | 9/2009 | Kong et al. |
| 2009/0310406 A1 | 12/2009 | Sarin et al. |
| 2009/0319868 A1 | 12/2009 | Sharon et al. |
| 2011/0141815 A1 | 6/2011 | Haratsch et al. |
| 2011/0145487 A1 | 6/2011 | Haratsch et al. |
| 2011/0145681 A1 * | 6/2011 | Yang ........................... 714/773 |
| 2011/0167305 A1 | 7/2011 | Haratsch et al. |
| 2011/0225350 A1 | 9/2011 | Burger, Jr. et al. |
| 2012/0163085 A1 * | 6/2012 | Alrod et al. ............ 365/185.18 |
| 2012/0213001 A1 * | 8/2012 | Yang .................. G06F 11/1048 365/185.2 |
| 2013/0019141 A1 | 1/2013 | Wang et al. |
| 2013/0145229 A1 * | 6/2013 | Frayer ............... H03M 13/2903 714/755 |
| 2013/0215678 A1 * | 8/2013 | Yang ................. G11C 16/349 365/185.03 |
| 2014/0059406 A1 | 2/2014 | Hyun et al. |
| 2015/0058536 A1 | 2/2015 | Seol et al. |

FOREIGN PATENT DOCUMENTS

| | | |
|---|---|---|
| JP | 2005078721 | 3/2005 |
| JP | 2006114078 | 4/2006 |
| JP | 2009272016 | 11/2009 |
| WO | 2002049039 | 6/2002 |
| WO | 2003100791 | 12/2003 |
| WO | 2004023489 | 3/2004 |
| WO | 2006013529 | 2/2006 |
| WO | 2006065655 | 6/2006 |
| WO | 2007043042 | 4/2007 |
| WO | 2007132457 | 11/2007 |
| WO | WO 2007/132453 A2 | 11/2007 |
| WO | WO 2007/149678 | 12/2007 |
| WO | WO 2007/149678 A2 | 12/2007 |
| WO | 2008011439 | 1/2008 |
| WO | 2008019347 | 2/2008 |
| WO | WO 2008/042593 A1 | 4/2008 |
| WO | 2008053472 | 5/2008 |
| WO | 2008057822 | 5/2008 |
| WO | 2010039874 | 4/2010 |

* cited by examiner

MULTI-TIER DETECTION AND DECODING IN FLASH MEMORIES

CROSS-REFERENCE TO RELATED APPLICATIONS

The present application is a continuation-in-part patent application of U.S. patent application Ser. No. 13/063,874, filed Mar. 14, 2011, entitled "Methods and Apparatus for Soft Data Generation for Memory Devices Based on Performance Factor Adjustment," now U.S. Pat. No. 9,064,594; U.S. patent application Ser. No. 12/920,407, filed Jan. 4, 2011, entitled "Methods and Apparatus for Storing Data in a Multi-Level Cell Flash Memory Device With Cross-Page Sectors, Multi-Page Coding And Per-Page Coding," now U.S. Pat. No. 8,724,381; U.S. patent application Ser. No. 13/001,278, filed Feb. 25, 2011, entitled "Methods and Apparatus for Read-Side Intercell Interference Mitigation in Flash Memories," now U.S. Pat. No. 8,462,549; U.S. patent application Ser. No. 13/063,888, filed Aug. 31, 2011, entitled "Methods and Apparatus for Soft Data Generation in Flash Memories," now U.S. Pat. No. 8,830,748; and U.S. patent application Ser. No. 13/063,895, filed May 31, 2011, entitled "Methods and Apparatus for Soft Data Generation for Memory Devices Using Reference Cells," now U.S. Pat. No. 9,378,835; each incorporated by reference herein. The present application is related to U.S. patent application Ser. No. 13/731,766, filed on Dec. 31, 2012, entitled "Detection and Decoding in Flash Memories Using Correlation of Neighboring Bits," now U.S. Pat. No. 9,292,377, incorporated by reference herein.

FIELD

The present invention relates generally to flash memory devices and more particularly, to improved techniques for mitigating the effect of noise and intercell interference and other distortions in such flash memory devices with low overall processing delay.

BACKGROUND

A number of memory devices, such as flash memory devices, use analog memory cells to store data Each memory cell stores an analog value, also referred to as a storage value, such as an electrical charge or voltage. The storage value represents the information stored in the cell. In flash memory devices, for example, each analog memory cell typically stores a certain voltage. The range of possible analog values for each cell is typically divided into threshold regions, with each region corresponding to one or more data bit values. Data is written to an analog memory cell by writing a nominal analog value that corresponds to the desired one or more bits.

Single-level cell (SLC) flash memory devices, for example, store one bit per memory cell (or two possible memory states). Multi-level cell (MLC) flash memory devices, on the other hand, store two or more bits per memory cell (i.e., each cell has four or more programmable states). In multi-level NAND flash memory devices, for example, floating gate devices are employed with programmable threshold voltages in a range that is divided into multiple intervals with each interval corresponding to a different multibit value. To program a given multibit value into a memory cell, the threshold voltage of the floating gate device in the memory cell is programmed into the threshold voltage interval that corresponds to the value.

The analog values stored in memory cells are often distorted. The distortions are typically due to, for example, back pattern dependency (BPD), noise and intercell interference (ICI) and read disturb. For a more detailed discussion of distortion in flash memory devices, see, for example, J. D. Lee et al., "Effects of Floating-Gate Interference on NAND Flash Memory Cell Operation," IEEE Electron Device Letters, 264-266 (May 2002) or Ki-Tae Park, et al., "A Zeroing Cell-to-Cell Interference Page Architecture With Temporary LSB Storing and Parallel MSB Program Scheme for MLC NAND Flash Memories," IEEE J. of Solid State Circuits, Vol. 43 No. 4, 919-928, (April 2008), each incorporated by reference herein.

ICI is a consequence of parasitic capacitances between cells and is generally considered to be the one of the most prominent sources of distortion. Id. For example, ICI is known to increase with technology scaling and becomes a significant source of distortion of the threshold voltage distribution as transistor sizes become smaller. Thus, ICI is of particular concern for reliable MLC memories, as ICI limits the number of voltage levels that can reliably be stored in the MLC memory.

A number of techniques have been proposed or suggested for mitigating the effect of noise, ICI and other disturbances in flash memory devices. While these existing methods have helped to improve the decoding performance of flash memory devices, they suffer from a number of limitations, which if overcome, could further improve the reliability of flash memory devices. For example, current flash memory devices typically only use hard data from the flash memory, or consider only data read from a single page for detection. It is well known, however, that soft data can improve error rate performance in the decoding process. Also, considering data from multiple pages or wordlines can improve error rate performance.

Thus, a need exists for multi-tier detection and decoding techniques that feature multiple error recovery steps where advanced error recovery steps use soft data from the flash memory device or data from additional pages or wordlines. A need also exists for multi-tier detection and decoding and multi-tier error recovery techniques where data is recovered with low delay. As used herein, the terms "multi-tier detection and decoding" and "multi-tier error recovery" are used interchangeably.

SUMMARY

Generally, methods and apparatus are provided for multi-tier detection and decoding in flash memory devices. According to one embodiment of the invention, data from a flash memory device is processed by obtaining one or more read values for at least one bit in a given page of the flash memory device; converting the one or more read values for the at least one bit to a reliability value; performing an initial decoding of the at least one bit in a given page using the reliability value; and performing an additional decoding of the at least one bit in the given page if the initial decoding is not successful, wherein the additional decoding uses one or more of additional information for the given page and at least one value for at least one bit from at least one additional page.

According to another embodiment of the invention, data from a flash memory device is processed by obtaining one or more read values for at least one bit in a given page of the flash memory device; converting the one or more read values for the at least one bit to a reliability value; performing an initial decoding of the at least one bit in the given page using the reliability value; and performing additional decoding of the at least one bit in the given page if the initial decoding is not successful, wherein the additional decoding comprises one or more of the following steps: regenerating the reliability value for the at least one bit in the given page using a value for at least one bit from at least one additional page and decoding the at least one bit in the given page using the regenerated reliability value, wherein the at least one additional page is in a same wordline as the given page; obtaining a quantized estimate of a voltage stored on a cell of the flash memory device storing the at least one bit and decoding the at least one bit in the given page based on the quantized estimate; and regenerating the reliability value for the at least one bit in the given page using a value for at least one bit from at least one additional page and decoding the at least one bit in the given page using the regenerated reliability value, wherein the at least one additional page is in a different wordline than the given page.

A more complete understanding of the present invention, as well as further features and advantages of the present invention, will be obtained by reference to the following detailed description and drawings.

DETAILED DESCRIPTION

Figure 1:
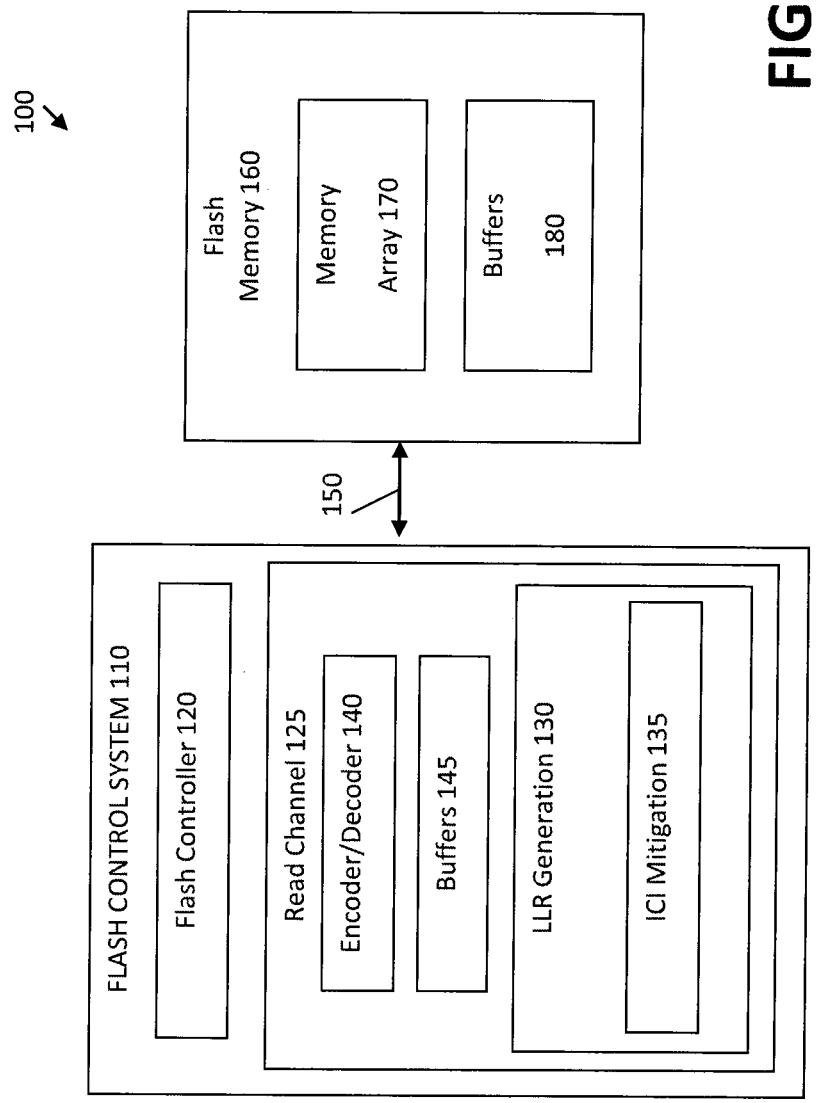
FIG. 1 is a schematic block diagram of an exemplary flash memory system incorporating multi-tier detection and decoding techniques in accordance with the present invention.

Various aspects of the invention are directed to multi-tier detection and decoding techniques and multi-tier error recovery techniques for mitigating, noise, ICI and other distortions in memory devices, such as single-level cell or multi-level cell (MLC) NAND flash memory devices. As used herein, the term "ICI mitigation" includes the mitigation of ICI and other data dependent distortions. As used herein, a multi-level cell flash memory comprises a memory where each memory cell stores two or more bits. Typically, the multiple bits stored in one flash cell belong to different pages. While the invention is illustrated herein using memory cells that store an analog value as a voltage, the present invention can be employed with any storage mechanism for flash or non-volatile memory devices, such as the use of voltages, currents or resistances to represent stored data, as would be apparent to a person of ordinary skill in the art.

Aspects of the present invention provide multi-tier error recovery techniques that comprise different levels of complexity and performance, with successive stages of increasing latency and correction capabilities. As the multi-tier error recovery techniques progress to a subsequent detection and decoding mode, the performance improves, while latency increases. As discussed hereinafter, the increased latency results from (i) larger iterations between the decoder/detector blocks, and/or more pronouncedly (ii) from more frequent access of the device, by readying additional pages, attempting reads at different threshold voltages, or reading additional neighboring wordlines. Thus, the latency of the overall architecture is significantly smaller on average than a comparable system of single stage decoding that implements a higher-complexity detection and decoding, technique all the time.

In one exemplary embodiment, a series of progressively more complex detection and decoding modes are invoked in sequence in the event of a codeword, page or block decoding failure. Aspects of the present invention recognize that flash memory devices benefit from a tiered approach in detection and decoding of errors that reserves stronger, albeit, slower mitigation schemes to lessen frequent error events. In a normal operating mode, hard read data of a flash page is mapped to reliability values or log-likelihood ratios (LLRs) (or approximations thereof), which are passed to the soft error correcting code (ECC) decoder that effectively corrects errors in a page without noticeably affecting the read channel throughput. Alternatively, reliability values or LLRs are computed based on the hard read data. As used herein, the terms "reliability value," "LLR" and "approximation of LLR" are used interchangeably.

More complex errors are correctable by a first exemplary recovery mode that reads one or more additional pages in the same wordline to enable stronger detection or decoding accuracy. A second exemplary recovery mode attempts several read retries of the same wordline to compute more accurate reliability values or LLRs that boost the detection or decoding correction power. A third exemplary recovery mode reads one or more additional neighboring wordlines, such as physically adjacent wordlines, to considerably enhance the quality of the reliability values or log-likelihood ratios (LLRs), made available to the iterative detection and decoding unit. Moreover, the order of these recovery modes can be programmed for a particular device to achieve a better tradeoff of throughput and error rate performance.

FIG. 1 is a schematic block diagram of an exemplary flash memory system 100 incorporating multi-tier detection and decoding techniques in accordance with aspects of the present invention. As shown in FIG. 1, the exemplary flash memory system 100 comprises a flash control system 110 and a flash memory block 160, connected by an interface 150. The exemplary flash control system 110 comprises a flash controller 120 and a read channel 125. Moreover, the read channel 125 comprises an encoder/decoder 140, and an LLR generation block 130. Finally, the LLR generation block 130 comprises an ICI mitigation block 135.

As discussed further below in conjunction with FIG. 4, the exemplary flash control system 110 implements one or more multi-tier error recovery processes (discussed further below in conjunction with FIGS. 5-9 that incorporate aspects of the present invention.

The exemplary read channel 125 comprises an encoder/decoder block 140 and one or more buffers 145. It is noted that the term "read channel" can encompass the write channel as well. In an alternative embodiment, the encoder/decoder block 140 and some buffers 145 may be implemented inside the flash controller 120. The encoder/decoder block 140 and buffers 145 may be implemented, for example, using well-known commercially available techniques and/or products, as modified herein to provide the features and functions of the present invention.

Generally, as discussed further below in conjunction with FIGS. 3-5 and 9, in a given processing mode, the exemplary LLR generation block 130 processes one or more read values from the flash memory 160, such as single bit hard values and/or quantized multi-bit soft values, and generates LLR values that are applied to the decoder 140, such as an exemplary low density parity check (LDPC) decoder.

Generally, as discussed further below in conjunction with FIGS. 3-4 and 6-9, the exemplary ICI mitigation block 135 is a function in the LLR generation block 130 that accounts for interference between neighboring cells in either generating the LLRs or computing adjusted read data values, based on which LLRs are computed. The exemplary flash memory block 160 comprises a memory array 170 and one or more buffers 180 that may each be implemented using well-known commercially available techniques and/or products.

In various embodiments of the disclosed multi-tier detection and decoding techniques, the exemplary interface 150 may need to convey additional information relative to a conventional flash memory system, such as values representing information associated with aggressor cells. Thus, the interface 150 may need to have a higher capacity or faster rate than an interface in conventional flash memory systems. On the other hand, in other embodiments, this additional information is conveyed to the flash control system 110 in a sequential manner which would incur additional delays. However those additional delays do not notably increase the overall delay due to their rare occurrence. When additional information-carrying capacity of the interface 150 is desired, the interface 150 may optionally be implemented, for example, in accordance with the teachings of International PCT Patent Application Serial No. PCT/US09/49328, published as PCT Patent Publication No. WO2010002943 A1, filed Jun. 30, 2009, entitled "Methods and Apparatus for Interfacing Between a Flash Memory Controller and a Flash Memory Array", incorporated by reference herein, which increases the information-carrying capacity of the interface 150 using, for example, Double Data Rate (DDR) techniques.

During a write operation, the interface 150 transfers the program values to be stored in the target cells, typically using page or wordline level access techniques. For a more detailed discussion of exemplary page or wordline level access techniques, see, for example, International Patent Application Serial No. PCT/US09/36810, filed Mar. 11, 2009, published as PCT Patent Publication No. WO2009114618 A1, entitled "Methods and Apparatus for Storing Data in a Multi-Level Cell Flash Memory Device with Cross-Page Sectors, Multi-Page Coding and Per-Page Coding," incorporated by reference herein.

During a read operation, the interface 150 transfers hard and/or soil read values that have been obtained from the memory array 170 for target and/or aggressor cells. For example, in addition to read values for the page with the target cell, read values for one or more neighboring pages in neighboring wordlines or neighboring even or odd bit lines are transferred over the interface 150. In the embodiment of FIG. 1, the disclosed multi-tier detection and decoding techniques are implemented outside the flash memory 160, typically in a process technology optimized for logic circuits to achieve the lowest area. It is at the expense, however, of the additional aggressor cell data that must be transferred on the interface 150.

Figure 2:
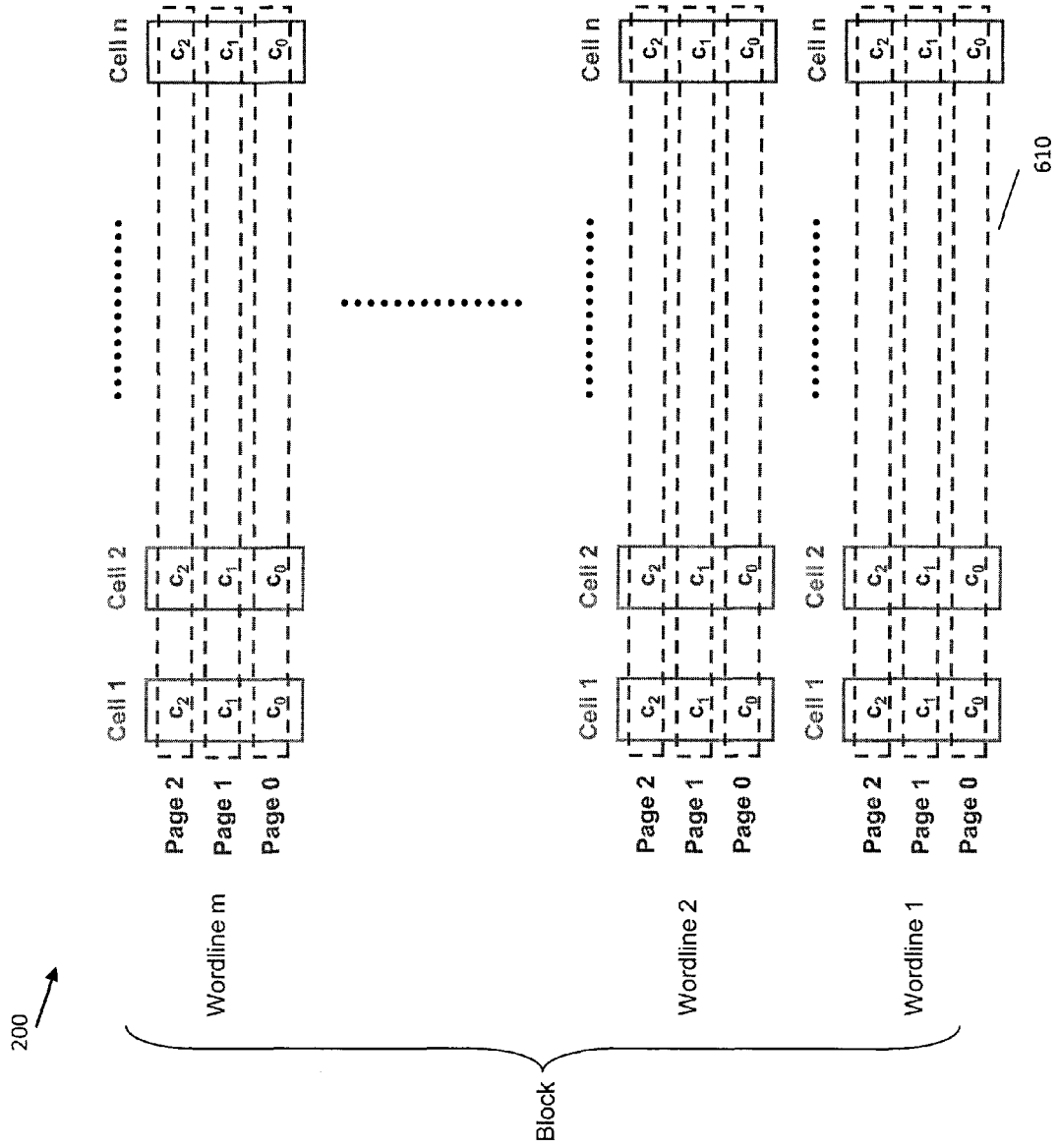
FIG. 2 illustrates an exemplary flash cell array in a multi-level cell (MLC) flash memory device in further detail.

FIG. 2 illustrates an exemplary flash cell array 200 in a multi-level cell (MLC) flash memory device 160 in further detail. As shown in FIG. 2, the exemplary flash cell array 200 stores three bits per flash cell, $c_i$. FIG. 2 illustrates the flash cell array architecture for one block, where each exemplary cell typically corresponds to a floating-gate transistor that stores three bits. The exemplary cell array 200 comprises m wordlines and n bitlines. Typically, in current multi-page cell flash memory devices, the bits within a single cell belong to different pages. In the example of FIG. 2, the three bits for each cell correspond to three different pages, and each wordline stores three pages. In the following discussion, pages 0, 1, and 2 are referred to as the lower, middle, and upper page levels within a wordline.

As indicated above, a flash cell array can be further partitioned into even and odd pages, where for example cells with even numbers (such as cells 2 and 4 in FIG. 2) correspond to even pages, and cells with odd numbers (such as cells 1 and 3 in FIG. 2) correspond to odd pages. In this case, a page (such as page 0) would contain an even page (even page 0) in even cells and an odd page (odd page 0) in odd cells.

Intercell Interference

Figure 3:
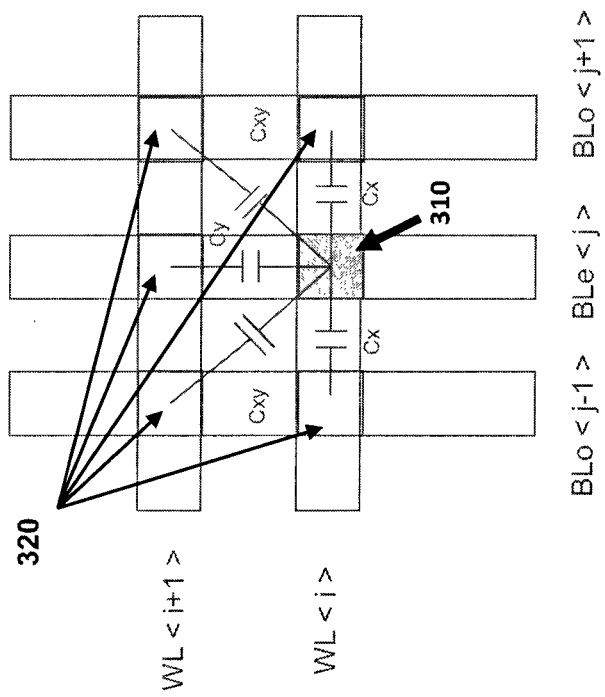
FIG. 3 illustrates the ICI that is present for a target cell due to the parasitic capacitance from a number of exemplary aggressor cells.

ICI is a consequence of parasitic capacitances between cells and is generally considered to be one of the most prominent sources of distortion. FIG. 3 illustrates the ICI that is present for a target cell 310 due to the parasitic capacitance from a number of exemplary aggressor cells 320. The following notations are employed in FIG. 3:

WL: wordline:
BL: bitline;
BLo: odd bitline;
BLe: even bitline; and
C: capacitance.

Aspects of the present invention recognize that ICI is caused by aggressor cells 320 that are programmed after the target cell 310 has been programmed. The ICI changes the voltage, $V_i$, of the target cell 310. In one exemplary embodiment, a "bottom up" programming scheme is assumed and adjacent aggressor cells in wordlines i and i+1 cause ICI for the target cell 310. With such bottom-up programming of a block, ICI from the lower wordline i−1 is removed, and up to five neighboring cells contribute to ICI as aggressor cells 320, as shown in FIG. 3. It is noted, however, that the techniques disclosed herein can be generalized to cases where aggressor cells from other wordlines, such as wordline i−1, contribute to ICI as well, as would be apparent to a person of ordinary skill in the art. If aggressor cells from wordlines i−1, i and i+1 contribute to ICI, up to eight closest neighboring cells are considered. Other cells that are further away from the target cell can be neglected, if their contribution to ICI is negligible. In general, the aggressor cells 320 are identified by analyzing the programming sequence scheme (such as bottom up or even/odd techniques to identify the aggressor cells 320 that are programmed after a given target cell 310.

The ICI caused by the aggressor cells 320 on the target cell 310 can be modeled in the exemplary embodiment as follows:

$$\Delta V_{ICI}^{(i,j)} = k_x \Delta V_t^{(i,j-1)} + k_x \Delta V_t^{(i,j+1)} + k_y \Delta V_t^{(i+1,j)} + k_{xy} \Delta V_t^{(i+1,j-1)} + k_{xy} \Delta V_t^{(i+1,j+1)} \quad (1)$$

where $\Delta V_t^{(w,b)}$ is the change in $V_t$ voltage of aggressor cell (w,b), $\Delta V_{ICI}^{(i,j)}$ is the change in $V_t$ voltage of target cell (i,j) due to ICI and $k_x$, $k_y$ and $k_{xy}$ are capacitive coupling coefficients for the x, y and xy direction.

Generally, $V_t$ is the voltage representing the data stored on a cell and obtained during a read operation. $V_t$ can be obtained by a read operation, for example, as a soft voltage value with more precision than the number of bits stored per cell when all pages in a wordline are read, or with two or more bits when only one page in a wordline is read, or as a value quantized to a hard voltage level with the same resolution as the number of bits stored per cell (e.g., 3 bits for 3 bits/cell flash) when all pages in a wordline are read, or a value quantized to one hard bit when only one page in a wordline is read.

Figure 4:
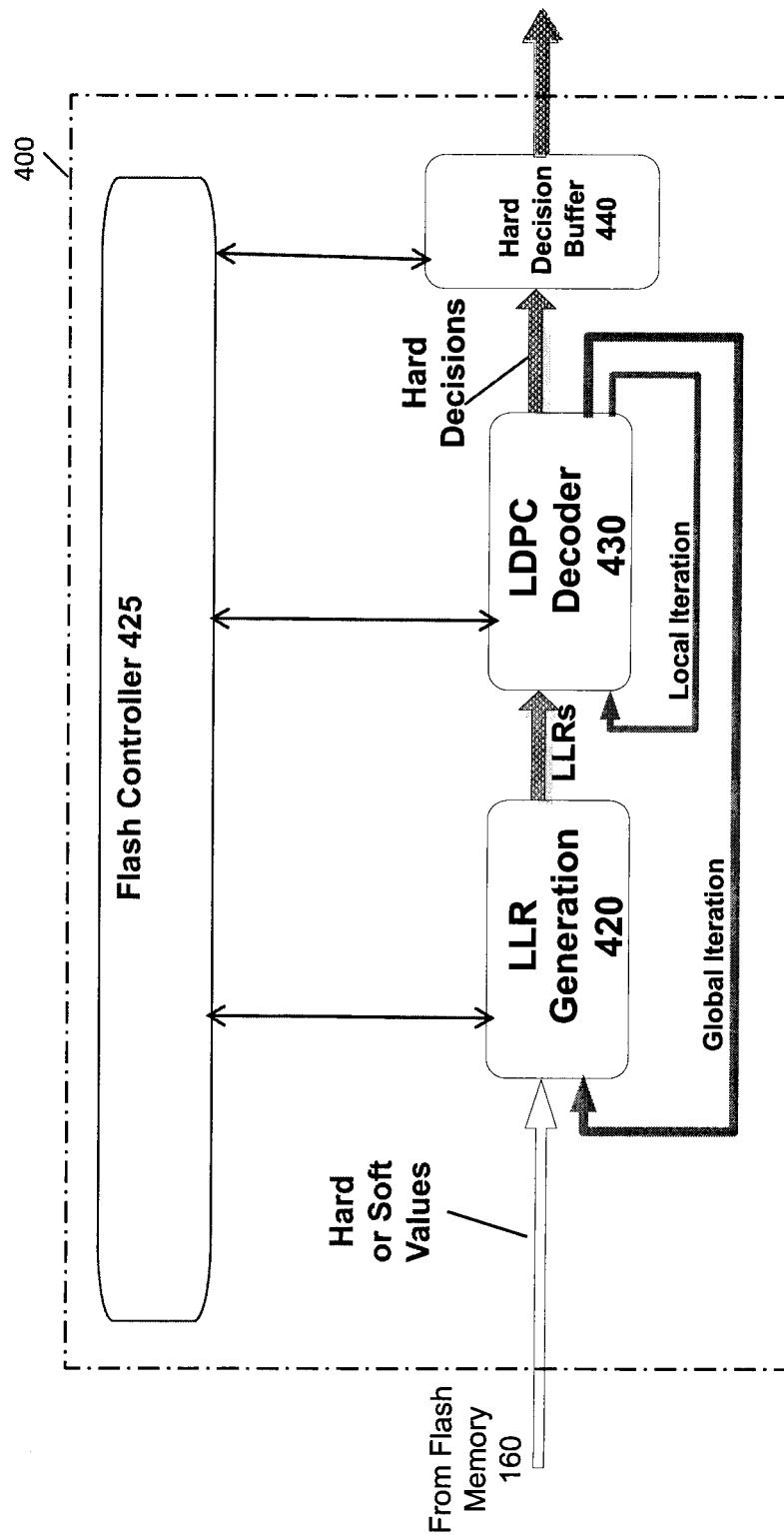
FIG. 4 is a schematic block diagram of an exemplary implementation of a flash memory system incorporating iterative detection and decoding techniques in accordance with aspects of the present invention.

FIG. 4 is a schematic block diagram of an exemplary implementation of a flash memory system 400 incorporating, iterative detection and decoding techniques in accordance with aspects of the present invention. As shown in FIG. 4, one or more read values are obtained from the memory array 170 of the flash memory 160. The read values may be, for example, a hard value or a soft value. In a normal mode, for example, a read value is obtained for at least one bit in a given page.

In a given processing mode, such as a normal mode or a recovery mode, an exemplary LLR generation block 420 processes the read values from the flash memory 160, such as single bit hard values and/or quantized multi-bit soft values, and generates LLR values that are applied to an exemplary LDPC decoder 430. The LLR generation performed by the exemplary LLR generation block 420 for each mode of the exemplary multi-tier detection and decoding is discussed further below in a section entitled "LLR Generation."

An exemplary flash controller 425 implements one or more multi-tier detection and decoding processes (discussed further below in conjunction with FIGS. 5-9) that incorporate aspects of the present invention. In addition, as discussed further below, an exemplary LDPC decoder 430 processes the LLRs generated by the exemplary LLR generation block 420 and provides hard decisions that are stored in hard decision buffers 440.

As discussed further below, the exemplary LDPC decoder 430 can iteratively decode the LLR values, e.g., until the read values are successfully decoded. Iterations inside the LDPC decoder 430 are called local iterations. In addition, as discussed further below, in one or more exemplary recovery modes, the exemplary LLR generation block 420 and the exemplary LDPC decoder 430 can globally iterate until the read values are successfully decoded. For a more detailed discussion of iterative detection and decoding using local and global iterations, see for example, U.S. patent application Ser. No. 13/063,888, filed Aug. 31, 2011, entitled "Methods and Apparatus for Soft Data Generation in Flash Memories," now U.S. Pat. No. 8,830,748.

Figure 5:
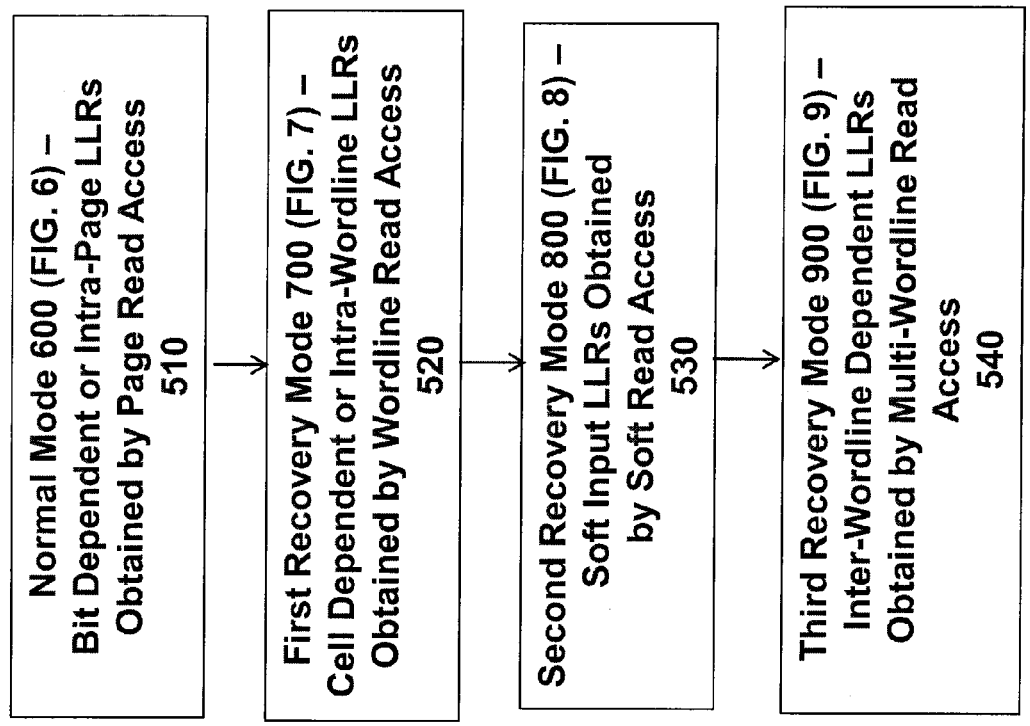
FIG. 5 is a flow chart describing an exemplary multi-tier detection and decoding process incorporating aspects of the present invention.

FIG. 5 is a flow chart describing an exemplary multi-tier detection and decoding process 500 incorporating aspects of the present invention. The exemplary multi-tier detection and decoding process 500 can be implemented by the flash control system 110 of FIG. 1. As shown in FIG. 5, the exemplary multi-tier detection and decoding process 500 initially performs a normal mode 600 during step 510. The normal mode 600 performed during step 510 is a real-time (on-the-fly) detection and decoding scheme. If the normal mode does not successfully decode the read values, one or more recovery modes 700, 800 and/or 900 can be attempted during steps 520, 530 and/or 540 in an offline manner. The order of steps in FIG. 5 is exemplary, and a different order could be employed to achieve a different tradeoff between error rate performance and throughput, as would be apparent to a person of ordinary skill in the art.

Generally, as discussed further below in conjunction with FIG. 6, the normal mode 600 generates bit dependent or intra-page LLRs that are computed based an read data obtained from the flash memory 160 during step 510 using a page read access scheme. The LLRs in this mode are called bit dependent or intra-page, since the LLRs depend only on data bits read from the current page.

If the normal mode 600 does not successfully decode the read values, the exemplary multi-tier detection and decoding process 500 attempts a first recovery mode 700 during step 520. As discussed further below in conjunction with FIG. 7, the exemplary first recovery mode 700 generates cell dependent or intra-wordline LLRs that are computed based on read data obtained from the flash memory 160 to obtain one or more recovery read values during step 520 using a wordline read access scheme. The LLRs in this mode are called cell dependent or intra-wordline, since the LLRs depend on data read from multiple pages within the same wordline. In other words, the LLR for a data bit in a flash cell is computed using read data for at least another data bit from another page stored in the same flash cell.

If the first recovery mode 700 does not successfully decode the read values, the exemplary multi-tier detection and decoding process 500 attempts a second recovery mode 800 to obtain one or more recovery read values during step 530. As discussed further below in conjunction with FIG. 8, the exemplary second recovery mode 800 generates soft input LLRs that are computed based on read data obtained from the flash memory 160 during step 530 using a soft read access scheme. The LLRs in this mode are called soft-input, since the LLRs are computed based on soft data read from the flash memory. This soft data is obtained either by multiple hard read operations with varying reference voltages as explained further below, or it is provided directly by the flash memory.

If the second recovery mode 800 does not successfully decode the read values, the exemplary multi-tier detection and decoding process 500 attempts a third recovery mode 900 to obtain one or more recovery read values during step 540. As discussed further below in conjunction with FIG. 9, the exemplary third recovery mode 900 generates inter-wordline dependent LLRs that are computed based on read data obtained from the flash memory 160 during step 540 using a multi-wordline read access scheme. The LLRs in this mode are called inter-wordline dependent, since the LLRs depend on data read from multiple wordlines.

For a more detailed discussion of exemplary page or wordline level read/write access techniques, see, for example, International Patent Application Serial No. PCT/US09/36810, filed Mar. 11, 2009, published as PCT Patent Publication No. WO2009114618 A1, entitled "Methods and Apparatus for Storing Data in a Multi-Level Cell Flash Memory Device with Cross-Page Sectors, Multi-Page Coding and Per-Page Coding," incorporated by reference herein.

Figure 6:
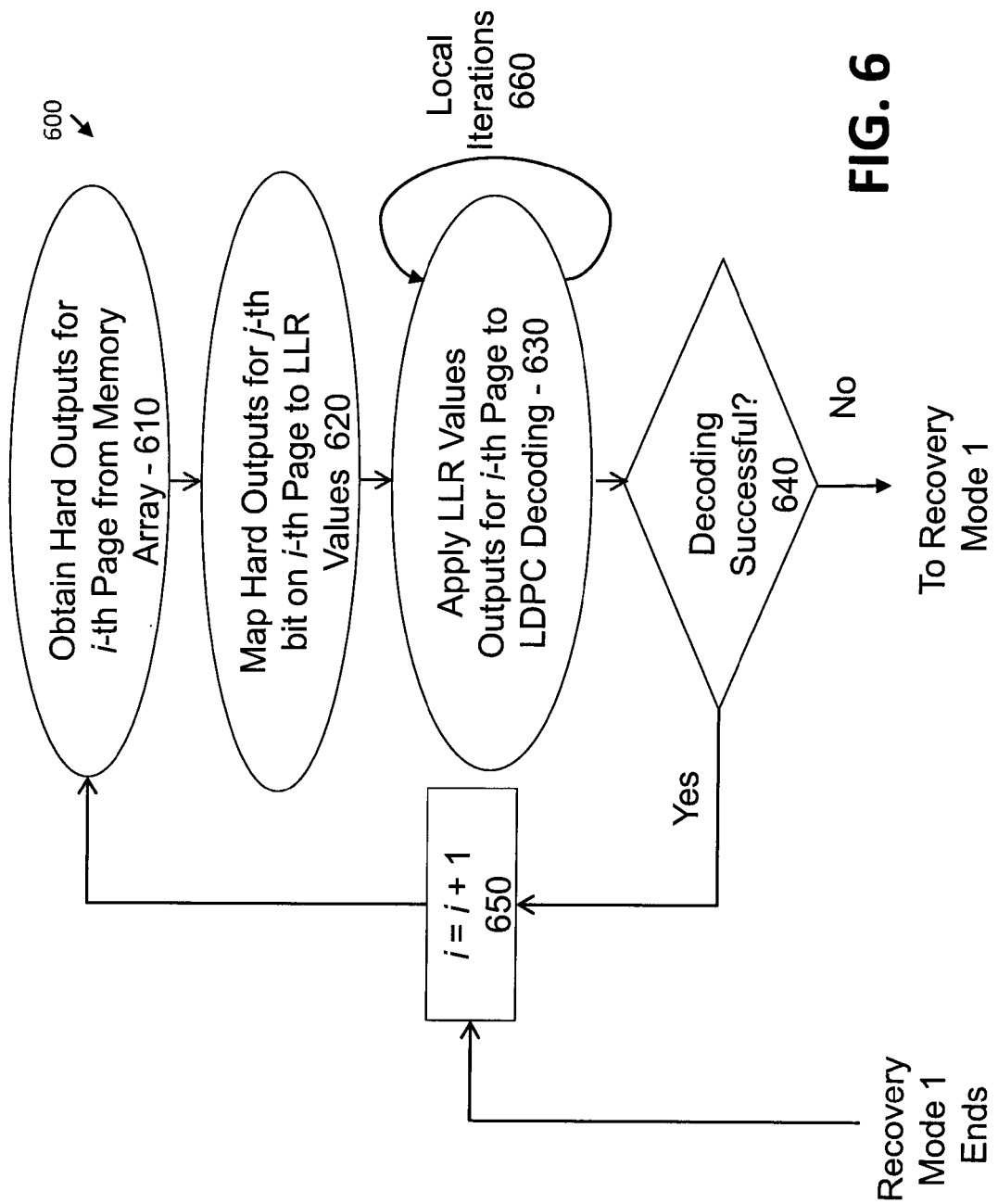
FIG. 6 is a flow chart describing an exemplary normal mode detection and decoding process.

FIG. 6 is a flow chart describing an exemplary normal mode detection and decoding process 600 incorporating aspects of the present invention. Generally, during a normal mode, the flash memory 160 provides only hard outputs. As indicated above, a page-wise access scheme is employed during the normal mode such that additional information on other pages in the same wordline is not required. In addition, the LDPC decoder 430 may not employ global iterations. Thus, as discussed hereinafter, the LLRs are obtained using calculations based on observed data or error statistics of the current page.

As shown in FIG. 6, the exemplary normal mode detection and decoding process 600 initially obtains hard outputs for the i-th page from the memory array 170 during step 610. Thereafter, the exemplary normal mode detection and decoding process 600 employs the LLR generation block 420 to map the hard outputs for the j-th bit on the i-th page to LLR values during step 620, as discussed further below in the section entitled "LLR Generation." This mapping operation is either implemented using a look-up table or mathematical operations, where LLRs are computed based on the hard outputs. The LLR generation block 420 is an example of a reliability unit.

The generated LLR values for the i-th page are applied during step 630 to the LDPC decoder 430 for decoding, using, for example, a message passing algorithm. The LDPC decoder 430 optionally employs local iterations 660.

A test is performed during step 640 to determine if the decoding was successful. If it is determined during step 640 that the decoding was successful, then the page counter i is incremented during step 650 to process the next page. If, however, it is determined during step 640 that the decoding was not successful, then the exemplary normal mode detection and decoding process 600 initiates the first recovery mode 700 (FIG. 7).

As discussed further below in conjunction with FIG. 7, when the first recovery mode 700 ends, program control returns to step 650 to process the next page.

Figure 7:
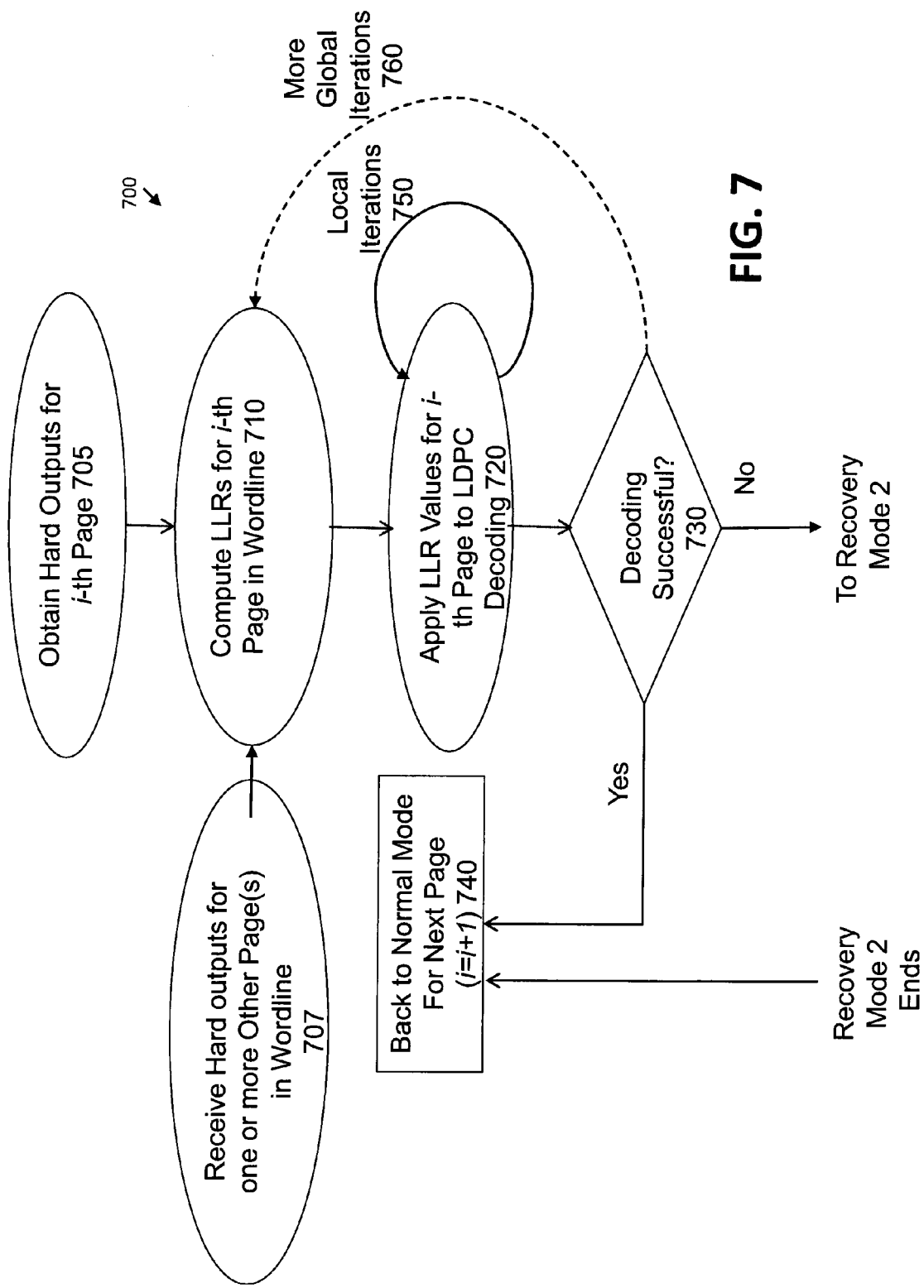
FIG. 7 is a flow chart describing an exemplary first recovery mode detection and decoding process.

FIG. 7 is a flow chart describing an exemplary first recovery mode detection and decoding process 700 incorporating aspects of the present invention. Generally, during a first recovery mode, the flash memory 160 provides only hard outputs using wordline (cell) access techniques, where one or more other pages in the same wordline are read. LLRs are computed based on hard outputs from the current page i and one or more other pages in the same wordline. These LLRs are utilized by the exemplary first recovery mode detection and decoding process 700. In addition, the LDPC decoder 430 employs one or more global iterations (optionally programmable).

As shown in FIG. 7, the exemplary first recovery mode detection and decoding process 700 initially obtains hard outputs for the i-th page (step 705) and one or more other pages in the same wordline (step 707). Hard outputs for the i-th page may still be available from step 610 and may therefore be reused. Then, the exemplary first recovery mode detection and decoding process 700 computes the LLRs for the i-th page in the current wordline based on hard outputs for the current i-th page and one or more other pages in the same wordline during step 710, as discussed further below in the section entitled "LLR Generation," As shown in FIG. 7, the LLR computation performed during 710 processes the hard outputs from the i-th page and one or more other pages in the same wordline to compute LLRs for the i-th page.

The LLR values for the i-th page are applied to the LDPC decoder 430 during step 720, optionally using local iterations 750.

A convergence test is performed during step 730 to determine if the decoding was successful. If it is determined during step 730 that the decoding was successful, then the page counter i is incremented during step 740 to process the next page in normal mode 600. If, however, it is determined during step 730 that the decoding was not successful, additional global iterations 760 are optionally performed between the LLR generation block 420 and LDPC decoder 430. The global iterations 760 are performed until the aforementioned convergence test indicates that decoding is now successful or the maximum allowable number of global iterations is reached.

Figure 8:
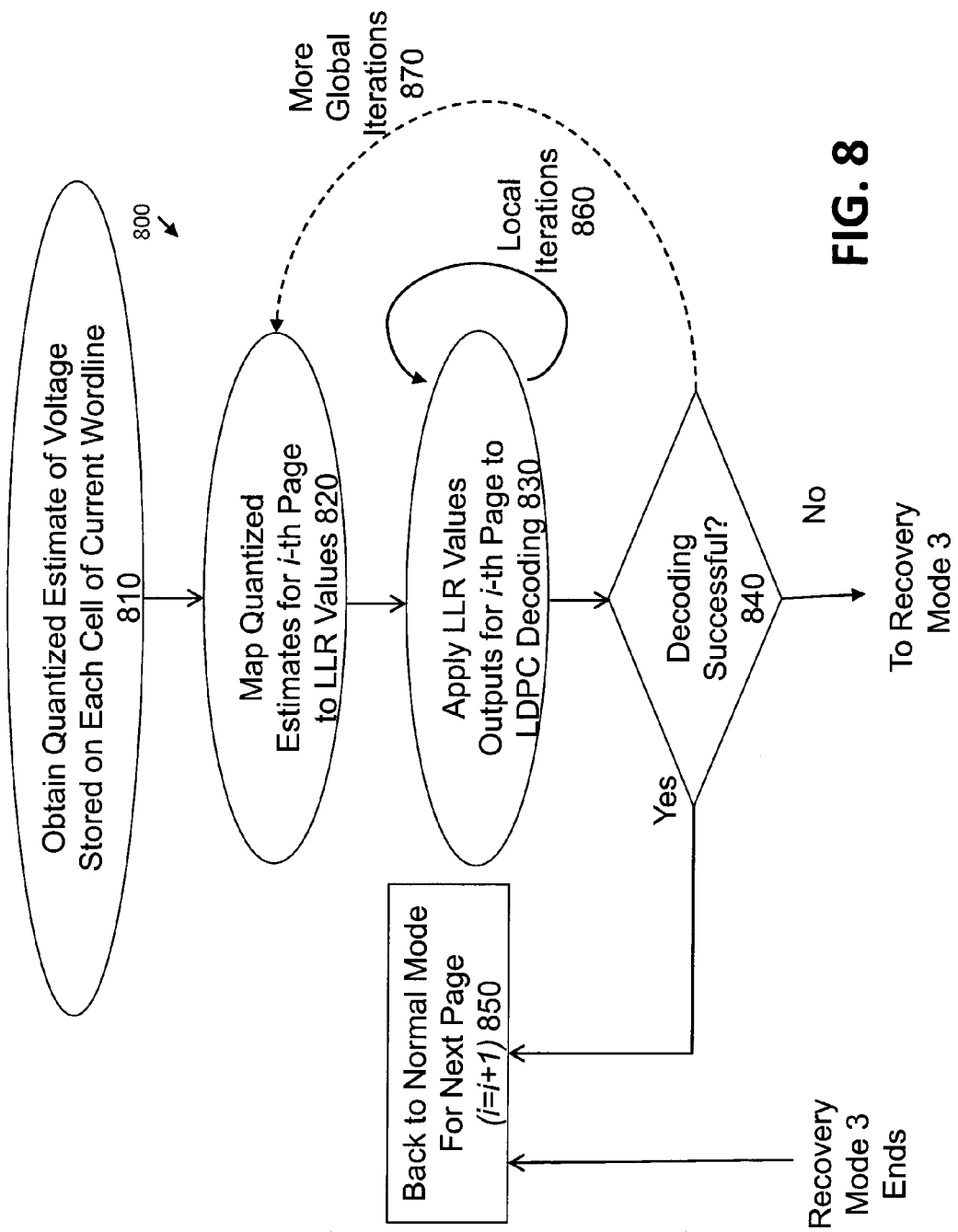
FIG. 8 is a flow chart describing an exemplary second recovery mode detection and decoding process.

Then, if it is determined during step 730 that the decoding was not successful and global iterations have been completed, then the exemplary first recovery mode detection and decoding process 700 initiates the second recovery mode 800 (FIG. 8).

As discussed further below in conjunction with FIG. 8, when the second recovery mode 800 ends, program control returns to step 740 to process the next page in normal mode 600.

FIG. 8 is a flow chart describing an exemplary second recovery mode detection and decoding process 800 incorporating aspects of the present invention. Generally, during a second recovery mode, soft-input decoding is employed, where several voltage read retries at different reference voltages provide a quantized estimate of the voltage stored on the cell. Alternatively, the soft data can be provided directly by the flash memory 160. The soft input LLRs are obtained using soft read access techniques. In addition, the LDPC decoder 430 employs one or more global iterations (optionally programmable).

As shown in FIG. 8, the exemplary second recovery mode detection and decoding process 800 initially obtains quantized estimates of the voltage stored on each cell of the current wordline (e.g., using several read retries at different reference voltages or directly from the memory array 170 as described further below) during step 810. The exemplary second recovery mode detection and decoding process 800 then maps the quantized estimates for the i-th page to LLR values during step 820 (optionally including neighbors of the i-th page in the same wordline), as discussed further below in the section entitled "LLR Generation." This mapping operation is either implemented using a look-up table or mathematical operations, where LLRs are computed based on the quantized estimates for the i-th page.

The LLR values for the i-th page are applied to the LDPC decoder 430 during step 830, optionally employing local iterations 860.

A convergence test is performed during step 840 to determine if the decoding was successful. If it is determined during step 840 that the decoding was successful, then the page counter i is incremented during step 850 to process the next page in normal mode 600. If, however, it is determined during step 840 that the decoding was not successful, additional global iterations 870 are optionally performed between the LLR generation block 420 and LDPC decoder 430. As indicated above, the global iterations 870 are performed until the aforementioned convergence test indicates that decoding is now successful or the maximum allowable number of global iterations is reached.

Figure 9:
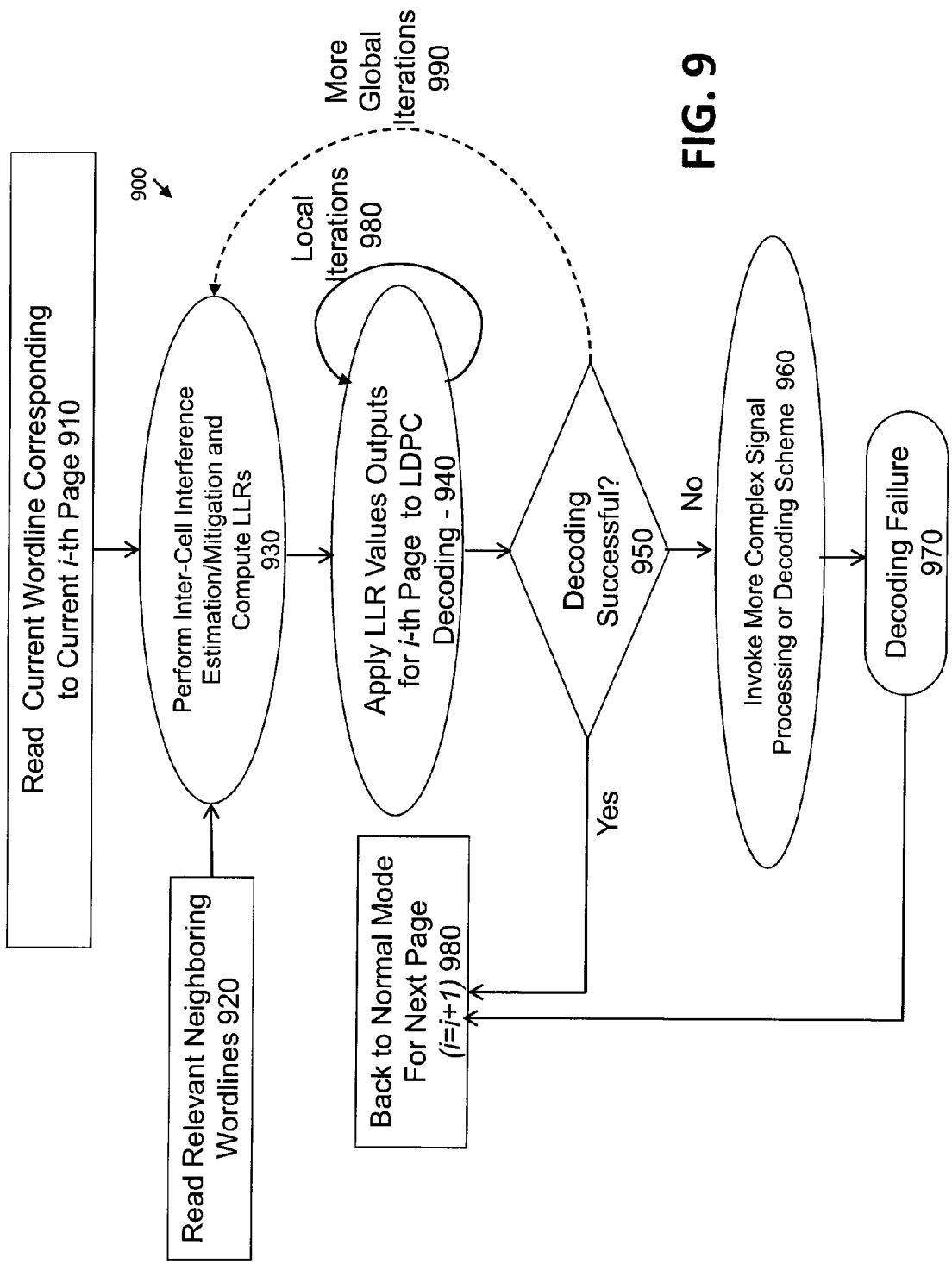
FIG. 9 is a flow chart describing an exemplary third recovery mode detection and decoding process.

Then, if it is determined during, step 840 that the decoding was not successful and global iterations have been completed, then the exemplary second recovery mode detection and decoding process 800 initiates the third recovery mode 900 (FIG. 9).

As discussed further below in conjunction with FIG. 9, when the third recovery mode 900 ends, program control returns to step 850 to process the next page in normal mode 600.

FIG. 9 is a flow chart describing an exemplary third recovery mode detection and decoding process 900 incorporating aspects of the present invention. Generally, during to third recovery mode, ICI mitigation and detection are employed by reading neighboring wordlines that are disturbance-coupled with the current wordline. Read data or error statistics across wordlines are utilized to calculate LLRs that are passed to the LDPC decoder 430. In addition, the LDPC decoder 430 employs one or more global iterations (optionally programmable).

As shown in FIG. 9, the exemplary third recovery mode detection and decoding process 900 initially obtains the current wordline corresponding to the current i-th page during step 910. The relevant neighboring wordlines are read during step 920. Read data for the current wordline (either hard data, quantized estimates or soft data) corresponding to the current i-th page may still be available from steps 810, 705, or 610 and reused. If not, the current wordline corresponding to the current i-th page is read.

The exemplary third recovery mode detection and decoding process 900 performs ICI estimation and mitigation during step 930 and computes the LLRs, as discussed further below in the section entitled "LLR Generation."

The adjusted LLR values for the i-th page are applied to the LDPC decoder 430 during step 940, optionally employing local iterations 980.

A convergence test is performed during step 950 to determine if the decoding was successful. If it is determined during step 950 that the decoding was successful, then the page counter i is incremented during step 980 to process the next page in normal mode 600. If, however, it is determined during step 950 that the decoding was not successful, additional global iterations 990 are optionally performed between the LLR generation block 420 and LDPC decoder 430. As indicated above, the global iterations 990 are performed until the aforementioned convergence test indicates that decoding is now successful or the maximum allowable number of global iterations is reached.

If it is determined during step 950 that the decoding was not successful and global iterations have been completed, then the exemplary third recovery mode detection and decoding process 900 optionally invokes more complex signal processing or decoding schemes during step 960.

As shown in FIG. 9, in the event of a decoding failure detected during step 970, the third recovery mode 900 ends and program control proceeds to step 980 to process the next page in normal mode 600.

For a more detailed discussion of ICI mitigation, see, for example, International Patent Application Serial No. PCT/US09/49326, filed Jun. 30, 2009, published as PCT Patent Publication No. WO2010002941 A1, entitled "Methods and Apparatus for Read-Side Intercell Interference Mitigation in Flash Memories," incorporated by reference herein.

LLR Generation

As previously indicated, each mode of the multi-tier detection and decoding process 500 converts one or more read values for one or more bits to a log likelihood ratio (LLR).

Normal Mode 600

As indicated above, the exemplary normal mode detection and decoding process 600 (FIG. 6) reads only the current page. Generally, the normal mode 600 is the fastest mode of operation where only a single hard read is required. The a-posteriori channel LLR of bit $b_i$ is calculated by reading only bits in the same page and optionally conditioned on specific channel indicators denoted by $\zeta$. The channel indicators $\zeta$ encompass the total effect of endurance, retention, and other channel quality indicators on the log-likelihood look-up table function f:

$$\lambda_i^{post} = \begin{cases} -f(1, \zeta, N(b_i)), & b_i = 1 \\ f(0, \zeta, N(b_i)), & b_i = 0 \end{cases}$$

The look up function f is optionally also a function of the neighborhood bits of bit $b_i$, denoted by $N(b_i)$, that belong to the same page. The lookup function f is computed offline based on the error statistics collected at a certain channel quality indicator $\zeta$ and stored in memory. In the above equation, extra information is assumed to be available that is conditioned on the value of each bit and its neighborhood of bits or the channel quality $\zeta$. When such information is not utilized or is not available, the LLR is calculated as follows:

$$\lambda_i^{post} = \begin{cases} -\lambda, & b_i = 1 \\ \lambda, & b_i = 0 \end{cases}$$

where $\lambda$ is chosen to minimize the failure probability of LDPC decoder 430, or set to the maximum possible soft input of the LDPC decoder 430, which is determined by the fixed point representation of the LDPC LLR input.

Figure 10:
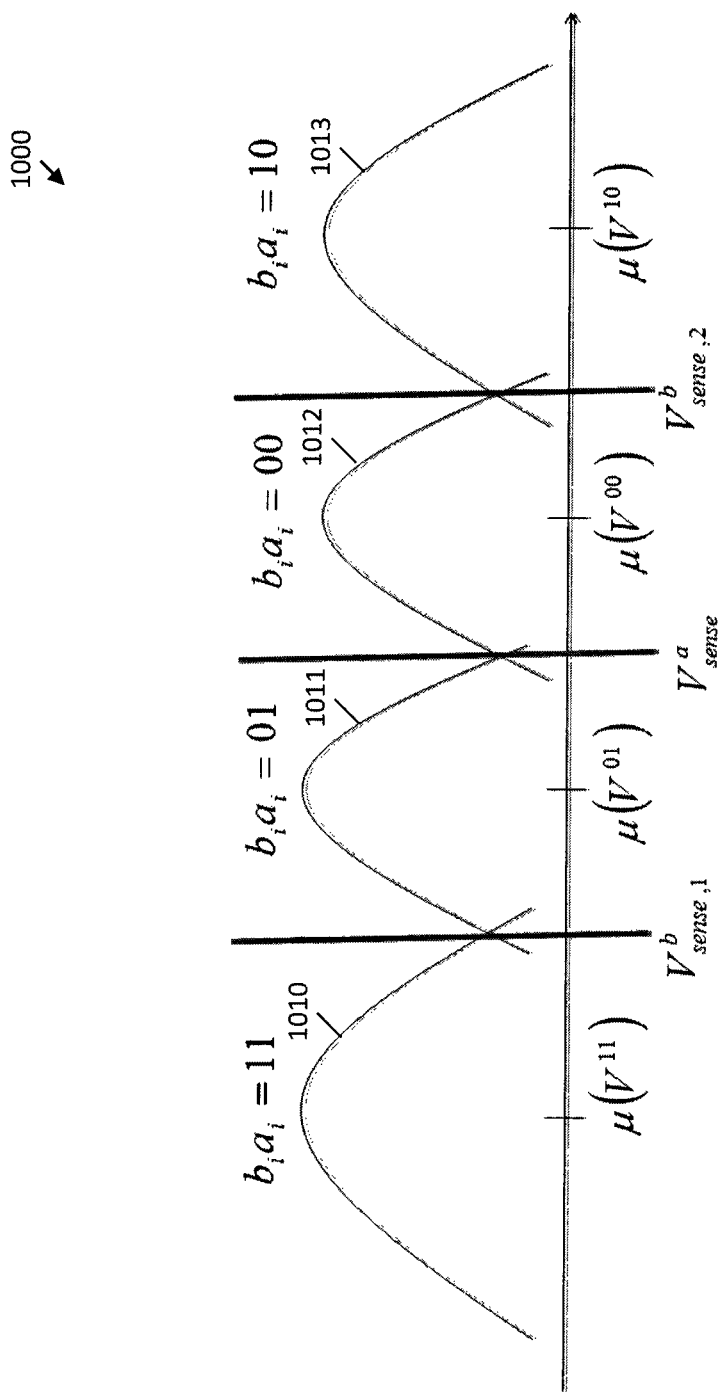
FIG. 10 illustrates an exemplary threshold voltage distribution for an exemplary multi-level cell flash memory.

In a NAND flash memory, such as a multi-level cell NAND flash memory, a threshold detector is typically employed to translate the voltage value associated with a particular cell to a predefined memory state. FIG. 10 illustrates an exemplary threshold voltage distribution for the exemplary multi-level cell flash memory 160 of FIG. 1, based on the teachings of U.S. Pat. No. 6,522,580, incorporated by reference herein. Generally, the threshold voltage of a cell is the voltage that needs to be applied to the cell so that the cell conducts a certain amount of current. The threshold voltage is a measure for the data stored in a cell.

In the exemplary embodiment shown in FIG. 10, each storage element employs four possible data states to store two bits of data in each memory cell. FIG. 10 illustrates four voltage probability distributions 1010-1013, with each distribution corresponding to one state.

The threshold voltage distributions 1010-1013 in graph 1000 are labeled with corresponding binary values. Thus, when a cell is in a first state 1010, it represents a "1" for the lower bit (also known as least significant bit, LSB) and a "1" for the upper bit (also known as most significant bit, MSB). State 1010 is generally the initial unprogrammed or erased state of the cell. Likewise, when a cell is in the second state 1011, it represents a "0" for the upper bit and a "1" for the lower bit. When a cell is in the third state 1012, it represents a "0" for the lower bit and a "0" for the upper bit. Finally, when a cell is in the fourth state 1013, it represents a "1" for the upper bit and a "0" for the lower bit.

Threshold voltage distribution 1010 represents a distribution of the threshold voltages $V_t$ of the cells within the array that are in an erased state ("11" data state), with threshold voltage levels below $V_{sense,1}^b$ volts. Threshold voltage distributions 1011 and 1012 of memory cells storing "01" and "00" user data, respectively, are shown to be between $V_{sense,1}^{b}$ and $V_{sense}^{a}$ volts and between $V_{sense}^{a}$ and $V_{sense,2}^{b}$ volts, respectively. Threshold voltage distribution 1013 shows the distribution of cells that have been programmed to the "10" data state, with a threshold voltage level set above $V_{sense,2}^{b}$.

The voltage level thresholds are used by the flash memory 160 (e.g., sensing circuits in the flash memory 160) to determine the voltage level or state of a given cell. The flash memory 160 will assign one or more bits to each cell based on a comparison of the measured voltages to the voltage level thresholds, which are then transmitted as hard decisions to the flash control system 110. In addition or alternatively, in an implementation using soft information, the flash memory 160 may transmit the measured voltages or a quantized version of the measured voltages to the flash control system 110 as soft information, where a larger number of bits is used to represent the measured voltage than the number of bits stored in the memory cell, or where a larger number of bits than the number of bits in a flash page is used to represent the data stored in a single flash page.

It is further noted that cells are typically programmed using well-known Program/Verify techniques. Generally, during a Program/Verify cycle, the flash memory 160 gradually applies an increasing voltage to store a charge in the cell transistor until a minimum target threshold voltage is exceeded. For example, when programming a '10' data state in the example of FIG. 10, the flash memory 160 may gradually apply an increasing voltage to store a charge in the cell transistor until a minimum target threshold voltage of $V_{sense,2}^{b}$ is exceeded.

As discussed above, each of the two bits stored in a single memory cell is from a different page. In other words, each bit of the two bits stored in each memory cell carries a different page address. The right side bit $a_i$, referred to herein as the lower bit (LSB) shown in FIG. 10, is accessed when a lower page address is input. The left side bit $b_i$ is accessed when an upper page address is input.

The value of bit $a_i$ is determined based on whether the cell conducts or not when a sensing or read reference voltage $V_{sense}^{a}$ is applied to it, termed a single hard read operation, as shown in FIG. 10.
Then, $$a_i \begin{cases} 0, & V_t > V_{sense}^{a} \\ 1, & V_t < V_{sense}^{a} \end{cases}$$

where $V_t$ is the threshold voltage of the cell that is determined by its stored charge. On the other hand, the value of bit $b_i$, referred to as the upper (MSB) bit, is determined based on whether the cell conducts or not when two sensing or read reference voltages $V_{1,sense}^{b}$ and $V_{2,sense}^{b}$ are applied to it, also a single hard read, then, $$b_i \begin{cases} 0, & V_{2,sense}^{b} > V_t > V_{1,sense}^{b} \\ 1, & V_{1,sense}^{b} > V_t, V_t > V_{2,sense}^{b} \end{cases}$$

First Recovery Mode 700

As indicated above, during the first recovery mode 700 (FIG. 7), the flash memory 160 provides only hard outputs using wordline (cell) access techniques, where the other pages in the same wordline are read and LLRs computed based on the current page and one or more other pages in the same wordline are utilized by the exemplary first recovery mode detection and decoding process 700. Thus, the log-likelihood table look up function f grows in the number of entries due to the additional addresses and variables. In an alternative embodiment, the LLRs are computed based on hard outputs for the current page and one or more other pages in the same wordline.

In the first recovery mode 700, the controller 425 thus has access to some or all the pages in the same wordline, and the number of hard reads required is less than or equal to the number of pages in each wordline. For an MLC example, where a wordline is composed of pages $p_a$ and $p_b$, the log-likelihood of hit $b_i$ in page $p_b$ is expressed as follows:

$$\lambda_i^{post} = \begin{cases} -f(1, \zeta, a_i, \lambda_{a_i}^{e}, f(a_i), \lambda_{N(a_i)}^{e}, f(b_i), \lambda_{N(b_i)}^{e}), & b_i = 1 \\ f(0, \zeta, a_i, \lambda_{a_j}^{e}, ((a_i), \lambda_{N(a_j)}^{e}, ((b_i), \lambda_{N(b_i)}^{e}), & b_i = 0 \end{cases}$$

where $a_i$ is the value of the bit located on page $p_a$ that belongs to the same cell as $b_i$, and $N(a_i)$ is the neighborhood of that bit on the same page $p_a$, where their corresponding extrinsic LLRs generated by the soft-input soft-output LDPC decoder in the previous global iterations are $\lambda_{a_i}^{e}$ and $\lambda_{N(a_i)}^{e}$, respectively. Also, the lookup function f is computed offline based on the error statistics collected at a certain channel quality indicator $\zeta$. If the LDPC decoder cannot generate soft outputs or no global iterations are performed, then the equations reduce to the form:

$$\lambda_i^{post} = \begin{cases} -f(1, \zeta, a_i, f(a_i), f(b_i)), & b_i = 1 \\ f(0, \zeta, a_i, ((a_i), ((b_j)), & b_i = 0 \end{cases}.$$

Second Recover Mode 800

As indicated above, during a second recovery mode 800, soft-input decoding is employed, where several voltage read retries at different reference voltages provide a quantized estimate of the voltage stored on the cell. The quantized estimates are obtained using soft read access techniques.

During the second recovery mode 800, the controller 425 attempts several hard reads of each page with varying reference voltages in order to obtain a quantized version of the charge stored on the cells. Having access to this multi-bit estimate enables the calculation of more accurate LLR information and considerably increases the possibility that soft-input LDPC decoding ECC can converge to the correct codeword, especially when the channel quality deteriorates significantly.

Figure 11:
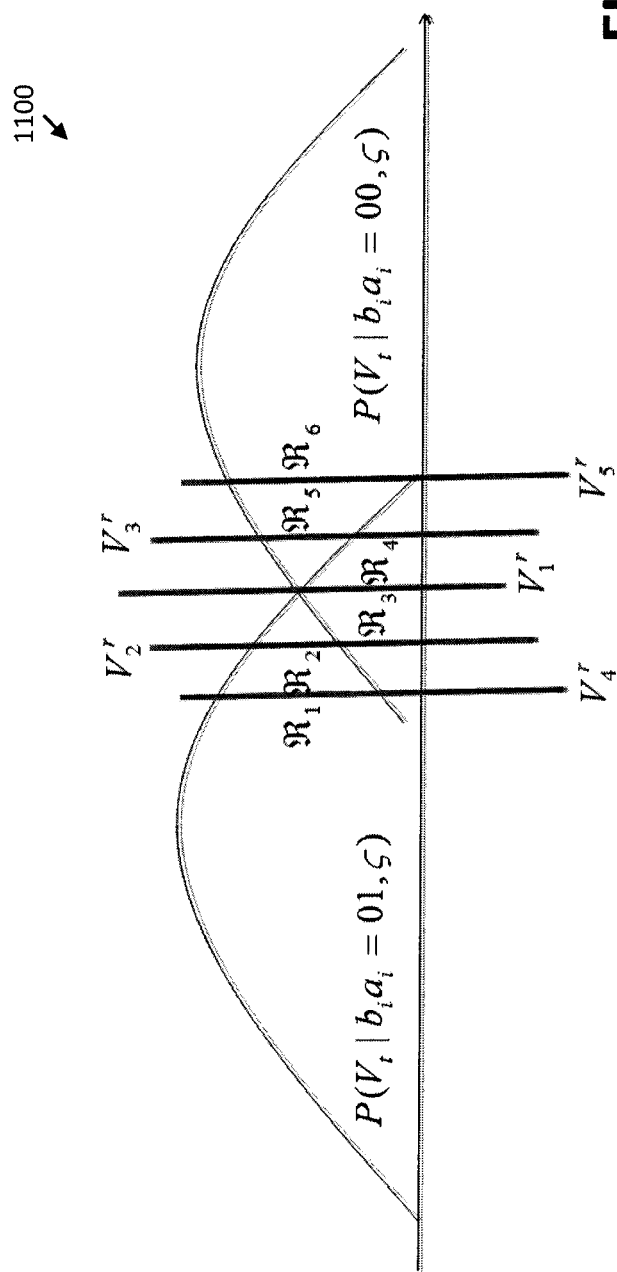
FIG. 11 illustrates the soft-input decoding employed during the second recovery mode of FIG. 8.

FIG. 11 illustrates the soft-input decoding employed during the second recovery mode 800, where, for example, several voltage read retries at different reference voltages $V_1^r$ through $V_5^r$ provide a quantized estimate of the voltage stored on the cell.

In generating, the LLR, it is assumed in the exemplary embodiment that the distributions of the cells are known beforehand through characterization of the flash for a specified channel quality indicator $\zeta$. An example is shown in FIG. 11 for the generation of soft information corresponding to five hard reads of the LSB page, $a_i$. In the soft-input decoding process, the five sensing voltages $V_1^r$ to $V_5^r$ are applied in sequence, in an arbitrary order, and depending on the conducting-non-conducting pattern, the controller 425 can determine in which region $\mathcal{R}_1$ through $\mathcal{R}_6$ the threshold voltage $V_t$ resides. For instance, if $V_t \in \mathcal{R}_5$, then the log-likelihood of the LSB bit is calculated s follows:

$$\lambda_i^{post} = \log \frac{\int_{V_5^r}^{V_5^r} P(v_t \mid b_i a_i = 00, \zeta) dv_t}{\int_{V_5^r}^{V_5^r} P(v_t \mid b_i a_i = 01, \zeta) dv_t}$$

In the above equation: in addition to center threshold line, $V_1^r$, several additional threshold lines $V_2^r$ to $V_5^r$ are added to capture the region in which the voltage $V_t$ resides. When the voltage falls in Region 5, for example, integration is used to calculate the area under the distribution (00) in region (R5), which is then divided by the area under the other distribution (01) in Region 5. The limits of integration define the region.

The above equation assumes no a-priori information is available about the LSB and MSB bits values, and that errors only occur between states '01' and '00'. However, given that extrinsic LLR is typically available as a result of previous global iterations, a more general formula is given as follows:

$$\lambda_i^{post} = \log \frac{\int_{V_5^r}^{V_5^r} P(v_t \mid b_i a_i = 10, \zeta) dv_t + e^{\lambda_{b_i}^e} \int_{V_5^r}^{V_5^r} P(v_t \mid b_i a_i = 00, \zeta) dv_t}{\int_{V_5^r}^{V_5^r} P(v_t \mid b_i a_i = 11, \zeta) dv_t + e^{\lambda_{b_i}^e} \int_{V_5^r}^{V_5^r} P(v_t \mid b_i a_i = 01, \zeta) dv_t}$$

Third Recovery Mode 900

As indicated above, during the third recovery mode 900, ICI estimation and mitigation are employed by reading neighboring wordlines that are disturbance-coupled with the current wordline. Read data and optionally error statistics across the wordlines are utilized to calculate LLRs that are passed to the LDPC decoder 430. These LLRs are optionally computed as pattern-dependent LLRs.

Thus, during the third recovery mode 900, the controller 425 reads physically neighboring wordlines of the wordline in order to compensate for inter-cell interference noise which further improves the probability of decoder convergence to the correct codeword. The third recovery mode 900 is the slowest recovery mode due to the number of additional read operations required compared to the first or second recovery mode 800. The formula to calculate LLRs for the third recovery mode 900 is the same as the formula to calculate LLRs for the second recovery mode 800, but the probability distributions are now conditioned on the hard values of the aggressor neighboring wordlines. Given that wordline j is being decoded, and that the controller 425 reads physically adjacent wordlines j−K, ..., j−1, j+1, ..., j+K, which represent the dominant aggressor neighboring wordlines (e.g., adjacent wordlines), the following distributions are substituted in the formulas of the second recovery mode 800 to arrive at the formulas for the third recovery mode 900 to account for inter-cell interference:

$$P(v_t \mid b_i^j a_i^j = XX, b_i^{j-K} a_i^{j-K}, \ldots, b_i^{j-1} a_i^{j-1}, b_i^{j+1} a_i^{j+1}, 1, b_i^{j+K} a_i^{j+K}, \zeta)$$

where "XX" indicates the $b_i a_i$ values for each of the four possible distributions. It typically suffices to consider wordlines j and j+1 to account for ICI, where wordline j contains the current page i to be decoded. See, for example, U.S. patent application Ser. No. 13/001,278, filed Feb. 25, 2011, entitled "Methods and Apparatus for Read-Side Intercell Interference Mitigation in Flash Memories," now U.S. Pat. No. 8,462,549.

The above-described LLR generation techniques are exemplary embodiments and additional techniques for the computation of LLRs are described, for example, in U.S. patent application Ser. No. 13/063,888, filed Mar. 14, 2011, entitled "Methods and Apparatus for Soft Data Generation in Flash Memories," now U.S. Pat. No. 8,830,348.

Process, System and Article of Manufacture Details

While a number of flow charts herein describe an exemplary sequence of steps, it is also an embodiment of the present invention that the sequence may be varied. Various permutations of the algorithm are contemplated as alternate embodiments of the invention. While exemplary embodiments of the present invention have been described with respect to processing steps in a software program, as would be apparent to one skilled in the art, various functions may be implemented in the digital domain as processing steps in a software program, in hardware by circuit elements or state machines, or in combination of both software and hardware. Such software may be employed in, for example, a digital signal processor, application specific integrated circuit, micro-controller, or general-purpose computer. Such hardware and software may be embodied within circuits implemented within an integrated circuit.

Thus, the functions of the present invention can be embodied in the form of methods and apparatuses for practicing those methods. One or more aspects of the present invention can be embodied in the form of program code, for example, whether stored in a storage medium, loaded into and/or executed by a machine, or transmitted over some transmission medium, wherein, when the program code is loaded into and executed by a machine, such as a computer, the machine becomes an apparatus for practicing the invention. When implemented on a general-purpose processor, the program code segments combine with the processor to provide a device that operates analogously to specific logic circuits. The invention can also be implemented in one or more of an integrated circuit, a digital signal processor, a microprocessor, and a micro-controller.

As is known in the art, the methods and apparatus discussed herein may be distributed as an article of manufacture that itself comprises a computer readable medium having computer readable code means embodied thereon. The computer readable program code means is operable, in conjunction with a computer system, to carry out all or some of the steps to perform the methods or create the apparatuses discussed herein. The computer readable medium may be a tangible recordable medium (e.g., floppy disks, hard drives, compact disks, memory cards, semiconductor devices, chips, application specific integrated circuits (ASICs)) or may be a transmission medium (e.g., a network comprising fiber-optics, the world-wide web, cables, or a wireless channel using time-di vision multiple access, code-division multiple access, or other radio-frequency channel). Any medium known or developed that can store information suitable for use with a computer system may be used. The computer-readable code means is any mechanism for allowing a computer to read instructions and data, such as magnetic variations on a magnetic media or height variations on the surface of a compact disk.

The computer systems and servers described herein each contain a memory that will configure associated processors to implement the methods, steps, and functions disclosed herein. The memories could be distributed or local and the processors could be distributed or singular. The memories could be implemented as an electrical, magnetic or optical memory, or any combination of these or other types of storage devices. Moreover, the term "memory" should be construed broadly enough to encompass any information able to be read from or written to an address in the addressable space accessed by an associated processor. With this definition, information on a network is still within a memory because the associated processor can retrieve the information from the network.

It is to be understood that the embodiments and variations shown and described herein are merely illustrative of the principles of this invention and that various modifications ma be implemented by those skilled in the art without departing from the scope and spirit of the invention.

We claim:

1. A method for processing data from a flash memory device, comprising the steps of:
   obtaining one or more initial read values for a given page of said flash memory device;
   converting, in a first converting step, said one or more initial read values for said given page to a reliability value;
   performing an initial decoding of said given page using said reliability value; and
   if said initial decoding is not successful, performing the following steps:
   obtaining one or more recovery read values using at least one additional read access of said flash memory device for one or more of said given page and at least one additional page of said flash memory device, wherein said given page and said at least one additional page comprise a plurality of bits, wherein said at least one additional page is in one or more of a same wordline and a different wordline as said given page, wherein said at least one additional read access comprises one or more of (i) reading substantially all of said at least one additional page in the same wordline as said given page; (ii) reading substantially all of the same wordline as said given page a plurality of times; and (iii) reading substantially all of one or more wordlines neighboring the same wordline as said given page;
   converting, in a second converting step, said one or more initial read values and said one or more recovery read values to at least one regenerated reliability value; and
   performing an additional decoding of said given page using said at least one regenerated reliability value.

2. The method of claim 1, wherein said additional decoding uses additional information for said given page comprising soft values based on a quantized estimate of a voltage stored on a cell of said flash memory device storing said given page.

3. The method of claim 2, wherein said quantized estimate of said voltage comprises one or more of hard decisions obtained by a plurality of read retries of said cell at a plurality of reference voltages and soft values directly from said flash memory device.

4. The method of claim 1, wherein said one or more recovery read values comprises one or more soft values from said at least one additional page in the same wordline as said given page.

5. The method of claim 1, wherein said at least one additional page is in a different wordline than said given page, and wherein said one or more recovery read values is obtained for said at least one additional page and used to generate said at least one regenerated reliability value for said given page.

6. The method of claim 5, wherein said one or more recovery read values is used to generate said at least one regenerated reliability value for said given page based on intercell interference mitigation.

7. The method of claim 1, wherein said one or more initial read values and said one or more recovery read values comprise one or more of a hard value and a soft value.

8. The method of claim 1, wherein said flash memory device comprises a plurality of cells each capable of storing at least two levels per cell.

9. The method of claim 1, wherein one or more of said initial decoding and said additional decoding comprises a Low Density Parity Check Message Passing decoding.

10. The method of claim 1, wherein said initial decoding is performed in real-time and said additional decoding is performed in an offline manner.

11. The method of claim 1, wherein one or more of said initial decoding and said additional decoding is iteratively performed a plurality of times.

12. The method of claim 1, further comprising one or more of providing an output of said initial decoding in a feedback manner to said first converting step in a local iteration mode, and providing an output of said additional decoding in a feedback manner to said second converting step in a global iteration mode.

13. The method of claim 1, wherein said reliability value comprises one or more of a log-likelihood ratio and an approximation of a log-likelihood ratio.

14. The method of claim 1, wherein said additional decoding comprises a multi-tier process comprising a plurality of error recovery steps employing said at least one additional read access.

15. The method of claim 1, wherein said following steps comprise a multi-tier process comprising a plurality of error recovery steps, wherein an order of said plurality of error recovery steps is programmable.

16. The method of claim 1, wherein said following steps comprise a multi-tier process comprising a plurality of error recovery stages, wherein said plurality of error recovery stages comprises successive stages of one or more of increasing latency and increasing error correction capabilities.

17. The method of claim 1, wherein said following steps comprise a multi-tier process comprising a plurality of detection and decoding modes, wherein said plurality of detection and decoding modes have progressively increasing complexity.

18. The method of claim 17, further comprising the step of converting one or more read values for each of said plurality of detection and decoding modes to one or more of said at least one regenerated reliability value.

19. A tangible machine-readable recordable storage medium for processing data from a flash memory device, wherein one or more software programs stored on said tangible machine-readable recordable storage medium when executed by one or more processing devices implement the steps of the method of claim 1.

20. A method for processing data from a flash memory device, comprising:
   obtaining one or more read values for a given page of said flash memory device;
   converting said one or more read values for said given page to a reliability value;
   performing an initial decoding of said given page using said reliability value; and
   if said initial decoding is not successful, performing the following steps:

obtaining one or more recovery read values using at least one additional read access of said flash memory device for one or more of said given page and at least one additional page of said flash memory device, wherein said given page and said at least one additional page comprise a plurality of bits, wherein said at least one additional page is in one or more of a same wordline and a different wordline as said given page, wherein said at least one additional read access comprises one or more of (i) reading substantially all of said at least one additional page in the same wordline as said given page; (ii) reading substantially all of the same wordline as said given page a plurality of times; and (iii) reading substantially all of one or more wordlines neighboring the same wordline as said given page; and performing an additional decoding of said given page, wherein said additional decoding comprises one or more of the following steps:

regenerating said reliability value for said given page in a first regenerating step using at least one of said one or more recovery read values for said at least one additional page and decoding said given page using said regenerated reliability value, wherein said at least one additional page is in a same wordline as said given page;

obtaining a quantized estimate of a voltage stored on a cell of said flash memory device storing said given page and decoding said given page based on said quantized estimate, wherein said quantized estimate of said voltage is used as said at least one of said one or more recovery read values; and regenerating said reliability value for said given page in a second regenerating step using at least one of said one or more recovery read values for said at least one additional page and decoding given page using said reliability value generated in the second regenerating step, wherein said at least one additional page is in a different wordline than said given page.

21. The method of claim 20, wherein said second regenerating step performs intercell interference estimation and mitigation when regenerating said reliability value.

22. The method of claim 20, wherein said quantized estimate of said voltage comprises one or more of hard decisions obtained by a plurality of read retries of said cell at a plurality of reference voltages and soft values directly from said flash memory device.

23. The method of claim 20, wherein said additional decoding comprises said first regenerating step if said initial decoding is not successful, followed by said step of obtaining a quantized estimate if said first regenerating step is not successful, followed by said second regenerating step if said step of obtaining a quantized estimate is not successful.

24. A flash memory system, comprising:

a reliability unit for converting (i) one or more initial read values for a given page to a reliability value, and (ii) said one or more initial read values and one or more recovery read values obtained using at least one additional read access of said flash memory device for one or more of said given page and at least one additional page of said flash memory device to at least one regenerated reliability value, wherein said at least one additional read access comprises one or more of (i) reading substantially all of said at least one additional page in the same wordline as said given page; (ii) reading substantially all of the same wordline as said given page a plurality of times; and (iii) reading substantially all of one or more wordlines neighboring the same wordline as said given page, and wherein said one or more recovery read values are obtained if an initial decoding of said given page is not successful; and a decoder for performing (i) said initial decoding of said given page using said reliability value; and (ii) an additional decoding of said given page using said at least one regenerated reliability value if said initial decoding is not successful.

25. The flash memory system of claim 24, wherein said additional decoding uses additional information for said given page comprising soft values based on a quantized estimate of a voltage stored on a cell of said flash memory device storing said given page.

26. The flash memory system of claim 24, wherein said one or more recovery read values comprises one or more soft values from said at least one additional page of the same wordline as said given page.

27. The flash memory system of claim 24, wherein said at least one additional page is in a different wordline than said given page, and wherein said one or more recovery read values is obtained for said at least one additional page and used to generate said at least one regenerated reliability value for said given page.

28. The flash memory system of claim 24, wherein said initial decoding is performed in real-time and said additional decoding is performed in an offline manner.

29. The flash memory system of claim 24, wherein one or more of said initial decoding and said additional decoding is iteratively performed a plurality of times.

30. The flash memory system of claim 24, wherein said additional decoding comprises a multi-tier process comprising a plurality of error recovery steps employing one or more of additional information for said given page and at least one value for said at least one additional page.

* * * * *